United States Patent [19]

Kinoshita et al.

[11] Patent Number: 4,785,338
[45] Date of Patent: Nov. 15, 1988

[54] SEMI-CONDUCTOR I.C. ELEMENT

[75] Inventors: Takao Kinoshita; Shinji Sakai, both of Tokyo; Takashi Kawabata, Kanagawa; Nobuhiko Shinoda; Kazuya Hosoe, both of Tokyo, all of Japan

[73] Assignee: Canon Kabushiki Kaisha, Tokyo, Japan

[21] Appl. No.: 930,945

[22] Filed: Nov. 10, 1986

Related U.S. Application Data

[63] Continuation of Ser. No. 726,182, May 23, 1985, abandoned, which is a continuation of Ser. No. 450,744, Dec. 17, 1982, abandoned, which is a continuation of Ser. No. 176,575, Aug. 8, 1980, abandoned.

[30] Foreign Application Priority Data

Aug. 9, 1979 [JP] Japan .................... 54-101664

[51] Int. Cl.$^4$ ............ H01L 27/14; H01L 23/02; H01L 25/04
[52] U.S. Cl. ........................ 357/30; 357/74; 357/84
[58] Field of Search ........ 357/15 LA, 24 LA, 30-32, 357/72-75, 84, 29

[56] References Cited

U.S. PATENT DOCUMENTS

| | | | |
|---|---|---|---|
| 2,181,494 | 11/1939 | Nix | 357/30 |
| 2,644,852 | 7/1953 | Dunlap, Jr. | 357/30 |
| 3,102,242 | 8/1963 | Matarese | 357/19 |
| 3,281,606 | 10/1966 | Lueck | 357/30 |
| 3,448,351 | 6/1969 | Baertsch | 357/30 |
| 3,560,813 | 3/1969 | Phy | 357/30 |
| 3,651,564 | 3/1972 | Glass | 357/30 |
| 3,654,527 | 4/1972 | McCann | 357/19 |
| 3,842,263 | 10/1974 | Kornrumpf et al. | 357/19 |
| 3,969,751 | 7/1976 | Drukaroffi et al. | 357/30 |
| 3,990,100 | 11/1976 | Mamine et al. | 357/30 |
| 4,259,679 | 3/1981 | Knibb et al. | 357/17 |
| 4,293,768 | 10/1981 | Adachi et al. | 357/72 |
| 4,302,674 | 11/1981 | Adachi et al. | 357/84 |

FOREIGN PATENT DOCUMENTS

| | | | |
|---|---|---|---|
| 1276232 | 8/1968 | Fed. Rep. of Germany | 357/38 LA |
| 907569 | 10/1962 | United Kingdom | 357/30 D |

Primary Examiner—J. Carroll
Attorney, Agent, or Firm—Toren, McGeady & Associates

[57] ABSTRACT

In a monolithic sensor IC, the light sensing element is formed on a base plate and a light-absorber coating such as black paint is provided on the surface of the semiconductor at positions other than the light path to the light sensing element, with the surface of the light-sensing element being provided with a reflection-prevention coating and with the entire sensor being housed within a package, the inside of the package of the IC also being provided with light-absorbing black paint.

12 Claims, 1 Drawing Sheet

SEMI-CONDUCTOR I.C. ELEMENT

This is a continuation of application Ser. No. 726,182, filed Apr. 23, 1985, now abandoned, which is a continuation of application Ser. No. 450,744 filed Dec. 17, 1982, now abandoned, which was a continuation of application Ser. No. 176,575 filed Aug. 8, 1980, now abandoned.

BACKGROUND OF THE INVENTION

The present invention relates to improvement of a monolithic semiconductor IC element (hereinafter called monolithic sensor IC), wherein the light-sensing element is provided on the same base plate.

Until now, in the case of the monolithic sensor IC as mentioned above, in many cases the light beam is also incident upon parts other than the light-sensing portion forming the light sensor. However, in case of such a monolithic sensor IC, electrons or positive holes are produced by means of the incidence of the light beam upon semiconductor parts other than the sensor or the p-n junction part so as to influence the output of the sensor, thereby causing problems because the noise index is substantially raised.

Further, in a case, for example, where the sensor output of the monolithic sensor IC is applied as a digital signal for effecting some control function, there is the possibility that erroneous operations could often occur if the noise component exceeds the noise margin of a digital circuit to which it may be applied.

SUMMARY OF THE INVENTION

An object of the present invention is to lower the noise index of this kind of conventional monolithic sensor IC.

In accordance with the present invention, a monolithic IC element having a light-sensing element irremovably built into the IC is designed in such a manner that in order to shade out light impinging other parts, particularly semiconductor parts other than the light incidence surface of the light-sensing element, light-shading members or a low-reflection substance are provided on surface portions other than the sensor portion. Further, other parts not in the incidence light path to the sensor in the package containing the monolithic sensor IC are also covered with the light-shading member or the light-absorbing substance.

In this way, it is possible to prevent light incidence upon parts other than the light-sensing surface of the monolithic IC so as to check the growth of undesired electrons, undesired positive holes, and so on, in the same semiconductor base plate, so that the S/N ratio is improved so as to raise the reliability of the whole system.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there is illustrated and described a preferred embodiment of the invention.

DETAILED DESCRIPTION OF THE PREFERRED EMBODIMENT

Figure 1:
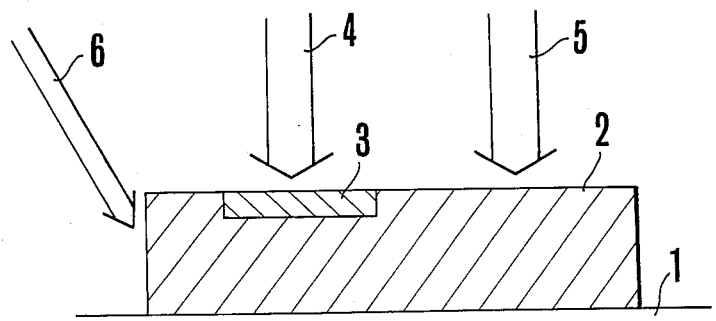
FIG. 1 is a schematic sectional diagram showing in general the incidence state of light upon the monolithic sensor IC in accordance with the present invention.

Referring now to the drawings and particularly to FIG. 1, there is shown a package 1 within which the IC is contained and a base plate 2 of the monolithic sensor IC consisting of p or n type semiconductor material, for example, silicon. A light-sensing element 3 is formed on the base plate 2 as a sensor, being for example a photodiode. Reference numerals 4, 5, and 6 represent incident light.

In addition to the light beam 4 which is assumed to be incident upon the sensor 3, other light beams 5 or 6 are also incident upon the base plate 2 of the semiconductor due to irregular reflection and they could operate to produce a charge. This charge could produce disadvantages in that it would influence the signal produced with the light beam 4 incident upon the sensor 3 so as to produce an undesired output which could often cause malfunctioning of the entire system.

Figure 2:
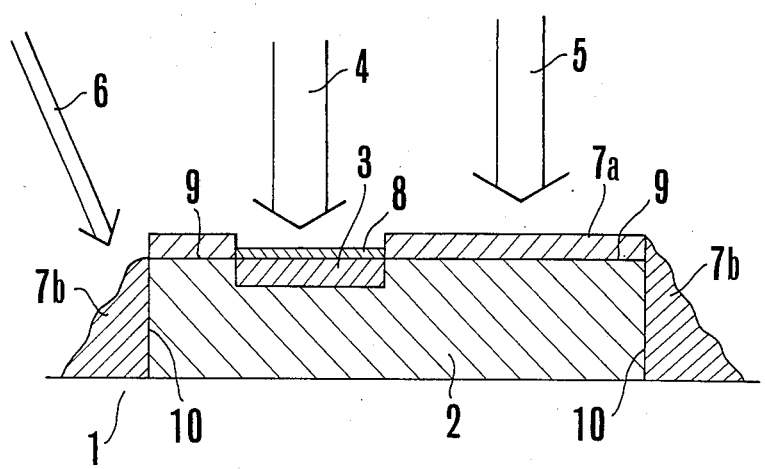
FIG. 2 is a schematic sectional view showing in general the monolithic sensor IC in accordance with the present invention.

FIG. 2 shows schematically a section of the construction of the monolithic semiconductor IC element in accordance with the present invention. In FIG. 2, similar parts are identified with similar reference characters as used in FIG. 1. In accordance with the invention, light-shading members 7a and 7b are provided on the upper surface 9 and the end surface 10, respectively, of the base plate 2 consisting, for example, of aluminum paint or dark phenol resin lacquer. Additionally, a reflection prevention film 8 is provided in accordance with the present invention, the film 8 being, for example, a coating of a dielectric substance with a certain determined thickness. A sufficient thickness for the film 8 is provided if it satisfies the condition of decreasing the reflection index on the surface of the sensor for the light incident upon the sensor element 3. Thus, the reflection index (ratio of reflected light to incident light) on the surface of the sensor for the light beam incident upon the sensor 3 is decreased, so that the efficiency of the incident light is increased, while flare and the like are prevented. If a substance having a low reflection rate, such as a dielectric substance, is applied on the surface of the sensor element 3, the light incident on the sensor 3 can be efficiently converted into electrical energy.

In the construction described above, the incidence of light upon positions other than the sensor is eliminated and the desired image is formed on the sensor 3. Further, in accordance with the present invention the light-shading members are provided also on the side surface 10 of the base plates 2 in order to prevent the possible incidence of light upon the side surfaces of the semiconductor plate 2. Particularly in a case where light is incident in the neighborhood of the sensor 3, this light is shaded by providing, for example, the aluminum paint on the upper surface of the base plate 2, in order to avoid the possibility that the light should enter into the base plate 2 at the edge of the light-shading member 7a, whereby an additional problem is also solved in accordance with the present invention.

Figure 3:
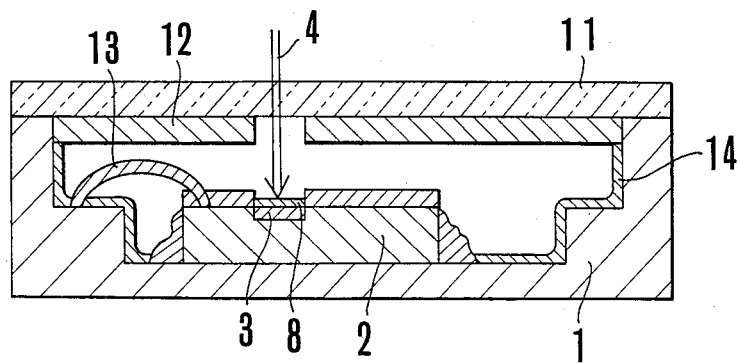
FIG. 3 is a sectional view showing the construction of the monolithic sensor IC in accordance with the present invention.

FIG. 3 shows in general the section of the assembly of the monolithic sensor IC in accordance with the present invention.

In FIG. 3, similar members are identified with the same reference characters as those used in FIGS. 1 and 2.

In the package depicted in FIG. 3, a permeable protection window 11 is formed at a part of the package. A substance such as black paint with superior light absorption characteristics is provided at 12 and 14 on a part of the internal surface of the permeable protection window 11 or the internal surface of the package 1. A conductor 13 is also provided having on its external surface a substance such as black paint with superior light absorption characteristics.

In the construction described above, as compared with prior art arrangements, the stray light in the package due to reflection can be completely avoided.

In accordance with the invention, the light-shading members 7a, 7b and the light-absorbing members 12, 14 and the like may consist of dark lacquers with light-absorbing efficiency and light-shading efficiency.

The substances which may be used include epoxy resin, silicone resin, urethane resin, and the like containing, for example, a black paint or a black dye, and such substances have been found to be remarkably reliable.

Besides the substances to be cemented or coated on the semiconductor base plate, the above members can be the light-shading substances formed by means of photo-etching or dispersion and so on.

As has been explained so far in detail, the semiconductor IC element in accordance with the present invention exhibits the following merits:

(1) It is possible to prevent the incidence of undesired light upon the light-sensing part.

(2) It is possible to eliminate the noise caused by the direct incidence of the undesired light beam upon the semiconductor base plate in the neighborhood of the light-sensing part.

(3) Thus, a single semiconductor IC element with low noise can be obtained.

While a specific embodiment of the invention has been shown and described in detail to illustrate the application of the inventive principles, it will be understood that the invention may be embodied otherwise without departing from such principles.

What is claimed is:

1. An image pickup device comprising:
  (a) photoelectric transducing means having a photoelectric transducing surface for converting light information into an electrical signal;
  (b) a package having said photoelectric transducing means sealed therein, said package having at least a part of the walls thereof made of a light-transmitting optical element to have incident light impinge on said photoelectric transducing surface through said optical element, said light-transmitting optical element having a surface opposed to said photoelectric transducing surface; and
  (c) light absorbing means containing a substance of high light-absorbing efficiency for absorbing the light reflected on the inside of said package, said light absorbing means covering said opposed surface of the light-transmitting optical element except a predetermined portion opposing to the photoelectric transducing surface, said portion having approximately the same size as said photoelectric transducing surface.

2. A semiconductor device according to claim 1, in which a surface of said photoelectric transducing means other than said photoelectric transducing surface is covered by light-shielding members.

3. A device according to claim 1, wherein said light absorbing means includes a coating.

4. A device according to claim 1, wherein said light absorbing means includes paint.

5. A photoelectric transducing device according to claim 2 in which said light-shielding members have a high light-absorbing quality.

6. A photoelectric transducing device according to claim 5 in which the light-shielding members consist of a lacquer or a paint.

7. A semiconductor device according to claim 1, further comprising a reflection-preventing member arranged on said photoelectric transducing surface.

8. An image pickup device, comprising:
  (a) photoelectric transducing means having a photoelectric transducing surface of predetermined area for converting light information into an electrical signal;
  (b) a package having said photoelectric transducing means sealed therein, said package having a wall made from a light-transmitting optical element, said wall having an opposing surface to said photoelectric transducing surface, said opposing surface being larger than said photoelectric transducing surface; and
  (c) light absorbing means arranged between said wall and said photoelectric transducing means for absorbing light reflected on an inside of said package, said light absorbing means having an opening for allowing light to pass through said wall to said photoelectric transducing surface and having substantially a same size as said photoelectric transducing surface.

9. An image pickup device according to claim 8, in which said transmitting optical element is in a planar form.

10. An image pickup device according to claim 8, in which the light absorbing means is provided in the package.

11. An image pickup device according to claim 10, in which said light absorbing means includes coating.

12. A device according to claim 11, wherein said coating includes paint or lacquer.

* * * * *

UNITED STATES PATENT AND TRADEMARK OFFICE
CERTIFICATE OF CORRECTION

PATENT NO.  : 4,785,338
DATED       : November 15, 1988
INVENTOR(S) : Takao Kinoshita et al It is certified that error appears in the above-identified patent and that said Letters Patent is hereby corrected as shown below:

In the heading of the Patent, it should read:

[63]  Related U.S. Application Data

Continuation of Serial No. 726,182, April 23, 1985

Signed and Sealed this

Eighteenth Day of April, 1989

*Attest:*

DONALD J. QUIGG

*Attesting Officer*      *Commissioner of Patents and Trademarks*